(12) United States Patent
Shin et al.

(10) Patent No.: US 11,870,020 B2
(45) Date of Patent: Jan. 9, 2024

(54) DISPLAY DEVICE

(71) Applicant: SAMSUNG DISPLAY CO., LTD., Yongin-si (KR)

(72) Inventors: Ha Yeon Shin, Busan (KR); Jong Woo Park, Seongnam-si (KR); Dae Youn Cho, Yongin-si (KR); Young Tae Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 154 days.

(21) Appl. No.: 17/076,009

(22) Filed: Oct. 21, 2020

(65) Prior Publication Data

US 2021/0265537 A1 Aug. 26, 2021

(30) Foreign Application Priority Data

Feb. 20, 2020 (KR) .................. 10-2020-0020966

(51) Int. Cl.
| | | |
|---|---|---|
| *H01L 33/54* | (2010.01) | |
| *G09G 3/20* | (2006.01) | |
| *H01L 33/56* | (2010.01) | |
| *H10K 19/00* | (2023.01) | |
| *H10K 50/80* | (2023.01) | |

(52) U.S. Cl.
CPC .............. *H01L 33/54* (2013.01); *G09G 3/20* (2013.01); *H01L 33/56* (2013.01); *H10K 19/00* (2023.02); *H10K 50/80* (2023.02); *G09G 2320/028* (2013.01); *G09G 2320/068* (2013.01)

(58) Field of Classification Search
CPC ......... H01L 33/54; H01L 27/28; H01L 33/56; H01L 51/52; G09G 2320/028; G09G 2320/068
See application file for complete search history.

(56) References Cited

U.S. PATENT DOCUMENTS 5,381,187 A * 1/1995 Takamatsu ........... H04N 5/7441
348/E9.027
2001/0044035 A1* 11/2001 Morii .................. H01L 51/5253
428/917

(Continued)

FOREIGN PATENT DOCUMENTS

| KR | 10-0136966 | 2/1998 |
| KR | 10-0861982 | 9/2008 |

(Continued)

*Primary Examiner* — Jay C Chang
*Assistant Examiner* — Mikka Liu
(74) *Attorney, Agent, or Firm* — F. Chau & Associates, LLC

(57) ABSTRACT

A display device may include a substrate. A first light emitting element is disposed on the substrate. A second light emitting element is disposed on the substrate and is positioned adjacent to the first light emitting element. A first encapsulation layer is disposed on the first light emitting element and the second light emitting element. A light path control layer is disposed on the first encapsulation layer. The light path control layer includes a first pattern overlapping the first light emitting element and having a first refractive index and a second pattern overlapping the second light emitting element and having a second refractive index that is greater than the first refractive index.

18 Claims, 3 Drawing Sheets

(56) References Cited

U.S. PATENT DOCUMENTS

| | | | | |
|---|---|---|---|---|
| 2003/0071569 A1* | 4/2003 | Chung | ............... | H10K 50/8426 |
| | | | | 313/512 |
| 2005/0147142 A1* | 7/2005 | Kito | ................... | H01S 5/18388 |
| | | | | 372/43.01 |
| 2008/0224153 A1* | 9/2008 | Tomoda | .............. | H01L 25/0753 |
| | | | | 438/34 |
| 2010/0051929 A1* | 3/2010 | Choi | ................... | H01L 51/5284 |
| | | | | 257/E51.026 |
| 2014/0361264 A1* | 12/2014 | Choi | ................... | H10K 50/858 |
| | | | | 257/40 |
| 2016/0315130 A1* | 10/2016 | Kajiyama | ........... | H01L 27/3258 |
| 2016/0370646 A1* | 12/2016 | Nishiyama | .............. | G03F 7/033 |
| 2018/0294440 A1* | 10/2018 | Ushikubo | .............. | H10K 71/00 |
| 2019/0157361 A1* | 5/2019 | Lee | ........................ | H10K 50/19 |
| 2022/0085335 A1* | 3/2022 | Shimatsu | ............... | H10K 59/38 |

FOREIGN PATENT DOCUMENTS

| | | |
|---|---|---|
| KR | 10-0879209 | 1/2009 |
| KR | 10-0903737 | 6/2009 |
| KR | 10-1200770 | 11/2012 |

\* cited by examiner

DISPLAY DEVICE

CROSS-REFERENCE TO RELATED APPLICATION(S)

This application claims priority under 35 U.S.C. § 119 to Korean Patent Application No. 10-2020-0020966, filed on Feb. 20, 2020 in the Korean Intellectual Property Office, the disclosure of which is incorporated by reference in its herein.

1. TECHNICAL FIELD

The present inventive concepts relate to a display device. More particularly, the present inventive concepts relate to a display device including an encapsulation layer that encapsulates a light emitting element.

2. DISCUSSION OF RELATED ART

The market for display devices for providing information to a user has increased as the field of information technology has developed. Accordingly, the use of flat panel display devices such as a liquid crystal display device, an organic light emitting display device, and a plasma display device has been increasing.

As the size of the display device is enlarged, there is an increased likelihood that multiple users will view an image displayed by the display device from various angles. Accordingly, a display device that displays an image with a wide viewing angle is desirous so that users may view the display device from different angles.

However, since display devices are frequently used in public places, there is also a need to display an image with a narrow viewing angle for personal privacy protection.

SUMMARY

Exemplary embodiments provide a display device that provide a selective viewing angle control.

A display device according to an exemplary embodiment of the present inventive concepts may include a substrate. A first light emitting element is disposed on the substrate. A second light emitting element is disposed on the substrate and is positioned adjacent to the first light emitting element. A first encapsulation layer is disposed on the first light emitting element and the second light emitting element. A light path control layer is disposed on the first encapsulation layer. The light path control layer includes a first pattern overlapping the first light emitting element and having a first refractive index and a second pattern overlapping the second light emitting element and having a second refractive index that is greater than the first refractive index.

In an exemplary embodiment, the first encapsulation layer may include an inorganic insulation material.

In an exemplary embodiment, the second pattern may include an organic insulation material.

In an exemplary embodiment, the first pattern may be an air gap.

In an exemplary embodiment, a cross section of the second pattern may have a shape in which a lower side is smaller than an upper side.

In an exemplary embodiment, the light path control layer may further include a capping layer disposed on the second pattern.

In an exemplary embodiment, the capping layer may include polyimide (PI).

In an exemplary embodiment, the capping layer may include lithium fluoride (LiF).

In an exemplary embodiment, the capping layer may contact an upper surface of the second pattern.

In an exemplary embodiment, the capping layer may contact an upper surface of the first encapsulation layer, a sidewall of the second pattern, and an upper surface of the second pattern.

In an exemplary embodiment, the second encapsulation layer may include an organic insulation material.

In an exemplary embodiment, the display device may further include a third encapsulation layer disposed on the second encapsulation layer, the third encapsulation layer including an inorganic insulation material.

In an exemplary embodiment, a color of a light emitted from the second light emitting element may be the same as a color of a light emitted from the first light emitting element.

In an exemplary embodiment, an emission area of the second light emitting element may be larger than an emission area of the first light emitting element.

In an exemplary embodiment, each of the first light emitting element and the second light emitting element may emit a light in a first mode, and the first light emitting element may emit the light and the second light emitting element may not emit the light in a second mode.

A display device according to an exemplary embodiment may include a substrate. An emission unit is disposed on the substrate. An encapsulation unit covers the emission unit. The encapsulation unit includes a first encapsulation layer disposed on the emission unit. A light path control layer is disposed on the first encapsulation layer. The light path control layer includes a plurality of first patterns having a first refractive index and a plurality of second patterns having a second refractive index that is greater than the first refractive index. A second encapsulation layer is disposed on the light path control layer.

In an exemplary embodiment, the emission unit may includes a plurality of first light emitting elements respectively overlapping the first patterns and a plurality of second light emitting elements respectively overlapping the second patterns.

In an exemplary embodiment, each of the first light emitting elements and the second light emitting elements may emit a light in a first mode, and each of the first light emitting element may emit the light and each of the second light emitting element may not emit the light in a second mode.

In an exemplary embodiment, a cross section of each of the second patterns may have a shape in which a lower side is smaller than an upper side.

In an exemplary embodiment, the light path control layer may further include a capping layer disposed on the second patterns.

The display device according to exemplary embodiments of the present inventive concepts may include the light path control layer disposed between the first encapsulation layer and the second encapsulation layer and including the first pattern and the second pattern having different refractive indexes from each other, the first pattern may overlap the first light emitting element, and the second pattern may overlap the second light emitting element. Thus, a path of light emitted from the first light emitting element and a path of light emitted from the second light emitting element may be different from each other. Accordingly, the display device may selectively display an image with a wide viewing angle or a narrow viewing angle by controlling the emission of the first light emitting element and the second light emitting element.

BRIEF DESCRIPTION OF THE DRAWINGS

Illustrative, non-limiting exemplary embodiments will be more clearly understood from the following detailed description of exemplary embodiments taken in conjunction with the accompanying drawings.

DETAILED DESCRIPTION OF EXEMPLARY EMBODIMENTS

Hereinafter, display devices in accordance with exemplary embodiments of the present inventive concepts will be explained in detail with reference to the accompanying drawings.

Figure 1:
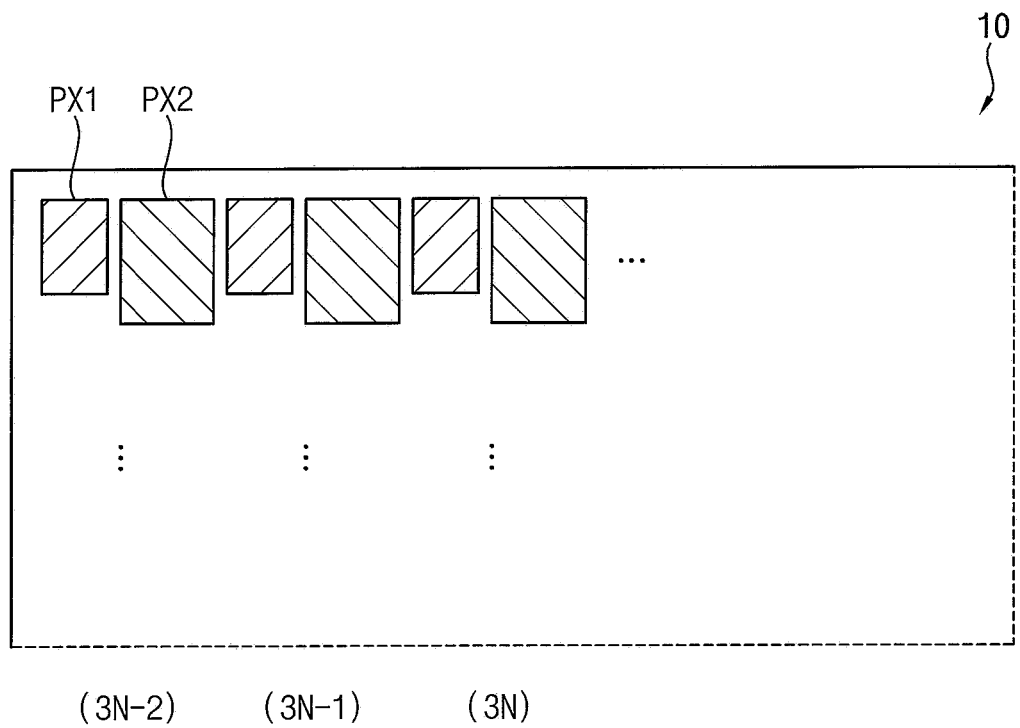
FIG. 1 is a plan view illustrating a portion of a display device according to an exemplary embodiment of the present inventive concepts.

FIG. 1 is a plan view illustrating a portion of a display device 10 according to an exemplary embodiment of the present inventive concepts.

Referring to the exemplary embodiment of FIG. 1, a display device 10 may include a plurality of pixels arranged in a substantial matrix form in a plan view. As used herein, 'pixels' refer to regions formed by dividing a display area in a plan view to display a color image. Each of the pixels of the plurality of pixels may express a predetermined primary color. For example, in an exemplary embodiment one pixel may be a minimum unit of the display device which may express a color independent from other pixels.

As shown in the exemplary embodiment of FIG. 1, the display device 10 may include a plurality of first pixels PX1 and a plurality of second pixels PX2. Each of the first pixels PX1 may display a first color, a second color, or a third color. Further, each of the second pixels PX2 may display the first color, the second color, or the third color similar to the first pixels PX1. For example, in an exemplary embodiment, the first color, the second color, and the third color may be red, green, and blue, respectively. However, exemplary embodiments of the present inventive concepts are not limited thereto. For example, in some exemplary embodiments the number of colors and the colors that are displayed by the plurality of first pixels PX1 and the plurality of second pixels PX2 may vary.

In an exemplary embodiment, the first pixel PX1 and the second pixel PX2 that are arranged sequentially in a row direction may form a basic unit, and the basic unit may be repeated in the row direction. Further, each of the first pixel PX1 and the second pixel PX2 may be arranged in a column direction.

In an exemplary embodiment, a first pixel PX1 and a second pixel PX2 adjacent to each other in the same column may display the same color. For example, as shown in the exemplary embodiment of FIG. 1, a first pixel PX1 and a second pixel PX2 in a (3N−2)-th column may display the first color, a first pixel PX1 and a second pixel PX2 in a (3N−1)-th column may display the second color, and a first pixel PX1 and a second pixel PX2 in a 3N-th column may display the third color. Here, N may be a natural number.

The display device 10 may be selectively driven in a first mode and a second mode. The first mode is a normal mode, and both the first pixel PX1 and the second pixel PX2 may display a color in the first mode. The display device 10 may provide an image with a relatively wide viewing angle in the first mode, so that a user may observe the image from various angles of the display device 10 including from a lateral side of the display device 10 as well as from a front of the display device 10 in the first mode.

The second mode is a private mode, and the first pixel PX1 may display a color and the second pixel PX2 may not display the color in the second mode. The display device 10 may provide an image with a relatively narrow viewing angle in the second mode. For example, in an exemplary embodiment, the user may observe the image which the display device 10 displays only from the front of the display device 10 in the second mode and may not observe the image from the lateral side of the display device 10 in the second mode.

As shown in the exemplary embodiment of FIG. 1, a size of the second pixel PX2 may be greater than a size of the first pixel PX1. For example, the area of the second pixel PX2 may be larger than the area of the first pixel PX1. In this exemplary embodiment, a brightness of a color which the second pixel PX2 displays may be greater than a brightness of a color which the first pixel PX1 displays. Therefore, the display device 10 may display an image having a relatively high brightness in the first mode in which both the first pixel PX1 and the second pixel PX2 display a color. Further, the display device 10 may display an image having a relatively low brightness in the second mode in which only the first pixel PX1 displays a color and the second pixel PX2 does not display the color. However, in other exemplary embodiments, the area of the second pixel PX2 may be the same as or less than the area of the first pixel PX1.

Figure 2:
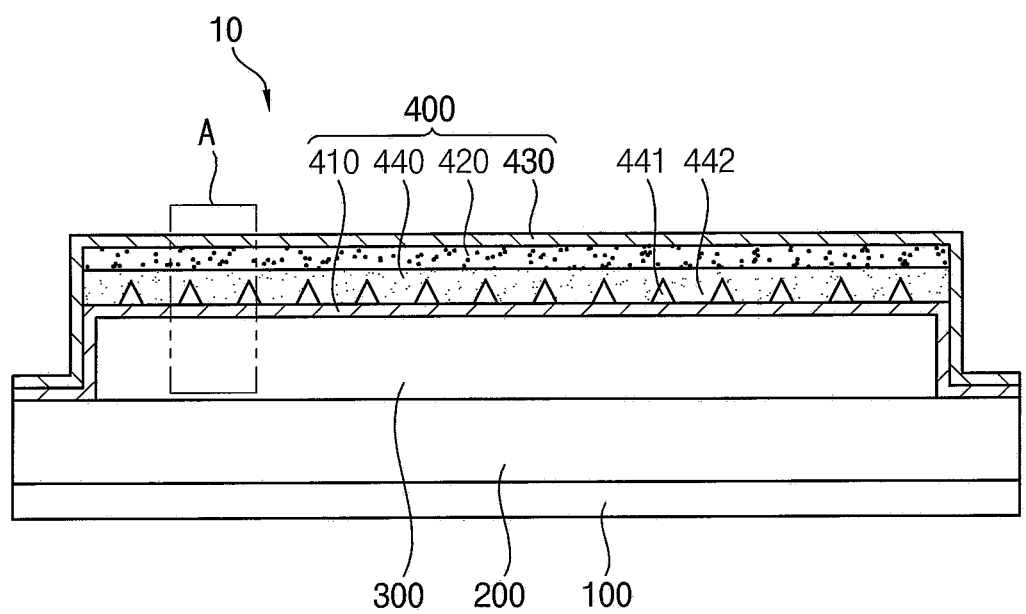
FIG. 2 is a cross-sectional view illustrating a display device according to an exemplary embodiment of the present inventive concepts.

FIG. 2 is a cross-sectional view illustrating a display device 10 according to an exemplary embodiment of the present inventive concepts.

Referring to the exemplary embodiment of FIG. 2, the display device 10 may include a substrate 100, a circuit unit 200, an emission unit 300, and an encapsulation unit 400.

The substrate 100 may support the circuit unit 200 and the emission unit 300. In an exemplary embodiment, the substrate 100 may be a transparent insulating substrate. The substrate 100 may be a rigid substrate or a flexible substrate. For example, the substrate 100 may be formed of at least one compound selected from glass, quartz, plastic, metal oxide, and the like. However, exemplary embodiments of the present inventive concepts are not limited thereto.

The circuit unit 200 may be disposed on the substrate 100. For example, as shown in the exemplary embodiment of FIG. 2, a lower surface of the circuit unit 200 may directly contact an upper surface of the substrate 100. The circuit unit 200 may provide signals, voltages, or the like to the emission unit 300. The circuit unit 200 may include a plurality of transistors and a plurality of capacitors. In an exemplary embodiment, the circuit unit 200 may include at least one semiconductor layer, a plurality of conductive layers, and insulation layers disposed therebetween.

The emission unit 300 may be disposed on the circuit unit 200. For example, as shown in the exemplary embodiment of FIG. 2, a lower surface of the emission unit 300 may directly contact an upper surface of the circuit unit 200. The emission unit 300 may emit light based on the signals, the voltage, or the like provided from the circuit unit 200. In an exemplary embodiment, the emission unit 300 may include a plurality of first light emitting elements and a plurality of second light emitting elements. However, in other exemplary embodiments, the number of the plurality of light emitting elements may be three or more. The emission unit 300 may include a plurality of conductive layers and an emission layer disposed therebetween.

The encapsulation unit 400 may be disposed on the emission unit 300. The encapsulation unit 400 may cover the emission unit 300, and an end portion of the encapsulation unit 400 may contact an end portion of the circuit unit 200. For example, a lateral side surface of the encapsulation unit 400 may contact a lateral end of the emission unit 300. The encapsulation unit 400 may encapsulate the emission unit 300 thereby preventing external gas, moisture, or the like from being flowed into the emission unit 300.

As shown in the exemplary embodiment of FIG. 2, the encapsulation unit 400 may include a first encapsulation layer 410, a second encapsulation layer 420, a third encapsulation layer 430, and a light path control layer 440. However, exemplary embodiments of the present inventive concepts are not limited thereto and in other exemplary embodiments, the number of encapsulation layers of the encapsulation unit 400 may vary.

The first encapsulation layer 410 may be disposed on the emission unit 300. For example, as shown in the exemplary embodiment of FIG. 2, the first encapsulation layer 410 may directly contact an upper surface and lateral edges of the emission unit 300. The first encapsulation layer 410 may cover the emission unit 300, and a lower surface on lateral end portions of the first encapsulation layer 410 may contact an upper surface of lateral end portions of the circuit unit 200. The first encapsulation layer 410 may prevent external gas, moisture, or the like from being flowed into the emission unit 300. In an exemplary embodiment, the first encapsulation layer 410 may include an inorganic insulation material.

The second encapsulation layer 420 may be disposed on the first encapsulation layer 410. The second encapsulation layer 420 may provide a planarized surface thereon. In an exemplary embodiment, the second encapsulation layer 420 may include an organic insulation material.

The third encapsulation layer 430 may be disposed on the second encapsulation layer 420. For example, as shown in the exemplary embodiment of FIG. 2, the third encapsulation layer 430 may directly contact an upper surface and lateral ends of the second encapsulation layer 420. The third encapsulation layer 430 may cover the second encapsulation layer 420, and lateral end portions of the third encapsulation layer 430 may contact lateral end portions of the first encapsulation layer 410. For example, a lower surface of lateral end portions of the third encapsulation layer 430 may contact an upper surface of lateral end portions of the first encapsulation layer 410. The third encapsulation layer 430 may prevent moisture or the like emitted from the second encapsulation layer 420 from flowing outside the encapsulation unit 400. In an exemplary embodiment, the third encapsulation layer 430 may include an inorganic insulation material.

As shown in the exemplary embodiment of FIG. 2, the light path control layer 440 may be disposed between the first encapsulation layer 410 and the second encapsulation layer 420 (e.g., in a thickness direction of the substrate 100). The light path control layer 440 may include a plurality of first patterns 441 and a plurality of second patterns 442 having different refractive indexes from each other. The first patterns 441 may respectively overlap (e.g., in a thickness direction of the substrate 100) the first light emitting elements, and the second patterns 442 may respectively overlap (e.g., in a thickness direction of the substrate 100) the second light emitting elements. The light path control layer 440 may control a path of light emitted from the first light emitting element of the emission unit 300 through the first pattern 441.

Figure 3:
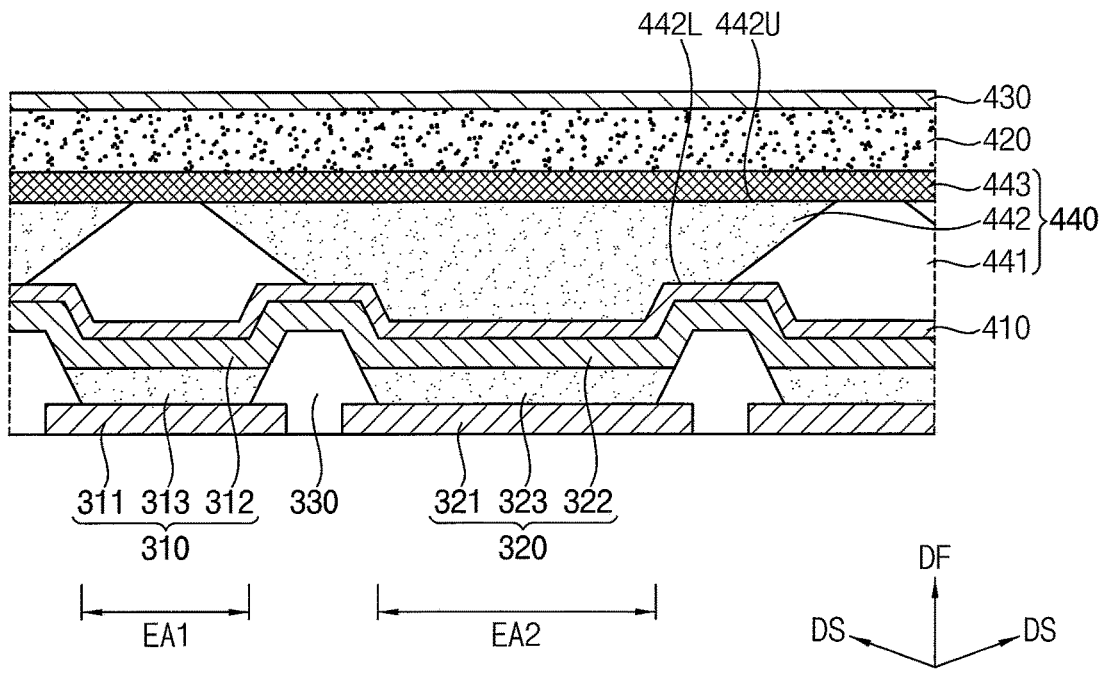
FIG. 3 is an enlarged cross-sectional view taken along area A of FIG. 2 illustrating an emission unit and an encapsulation unit according to an exemplary embodiment of the present inventive concepts.

FIG. 3 is an enlarged cross-sectional view illustrating the emission unit 300 and the encapsulation unit 400 according to an exemplary embodiment of the present inventive concepts. FIG. 3 may illustrate area A in FIG. 2 according to an exemplary embodiment of the present inventive concepts.

Referring to the exemplary embodiments of FIGS. 2 and 3, the emission unit 300 may include a first light emitting element 310 and a second light emitting element 320. The first light emitting element 310 and the second light emitting element 320 may be adjacent to each other and may be spaced apart from each other (e.g., in a direction parallel to an upper surface of the substrate 100). The first light emitting element 310 and the second light emitting element 320 may be included in the first pixel PX1 and the second pixel PX2 adjacent to each other illustrated in the exemplary embodiment of FIG. 1, respectively. In this exemplary embodiment, a color of light emitted from the second light emitting element 320 may be the same as a color of light emitted from the first light emitting element 310.

Each of the first light emitting element 310 and the second light emitting element 320 may include a first electrode, a second electrode, and an emission layer. For example, as shown in the exemplary embodiment, the first light emitting element 310 may include a first electrode 311, a second electrode 312, and an emission layer 313, and the second light emitting element 320 may include a first electrode 321, a second electrode 322, and an emission layer 323. The first electrode 311, the second electrode 312, and the emission layer 313 of the first light emitting element 310 may be substantially the same as or similar to the first electrode 321, the second electrode 322, and the emission layer 323 of the second light emitting element 320, respectively. Therefore, the first electrode 311, the second electrode 312, and the emission layer 313 of the first light emitting element 310 will be mainly described below for convenience of explanation.

In an exemplary embodiment, the first electrode 311 may be a reflective electrode. In an exemplary embodiment, the first electrode 311 may include a transparent conductive oxide layer and a metal layer. For example, the first electrode 311 may include silver (Ag), indium tin oxide (ITO), or the like. The first electrode 311 may be independently formed in each of the pixels. For example, as shown in the exemplary embodiment of FIG. 3, the first electrode 311 of the first light emitting element 310 and the first electrode 321 of the second light emitting element 320 may not be connected to each other.

The second electrode 312 may be disposed on the first electrode 311. The second electrode 312 may be a transmitting electrode. In an exemplary embodiment, the second electrode 312 may include a metal layer having a relatively small thickness. For example, the second electrode 312 may include at least one compound selected from aluminum (Al), platinum (Pt), silver (Ag), magnesium (Mg), gold (Au), chromium (Cr), tungsten (W), titanium (Ti), and the like. However, exemplary embodiments of the present inventive concepts are not limited thereto. As shown in the exemplary embodiment of FIG. 3, the second electrode 312 may be commonly formed in the pixels. For example, the second electrode 312 may extend from the first light emitting element 310 to the second electrode 322.

The emission layer 313 may be disposed between the first electrode 311 and the second electrode 312 (e.g., in a thickness direction of the substrate 100). The emission layer 313 may emit light based on an electric field formed between the first electrode 311 and the second electrode 312. The light generated from the emission layer 313 may be emitted in a direction toward the second electrode 312, or may be emitted in a direction toward the first electrode 311 and then may be reflected by the first electrode 311 toward the second electrode 312.

In an exemplary embodiment, the emission layer 313 may include at least one of an organic light emitting material and a quantum dot.

In an exemplary embodiment, the organic light emitting material may include a low molecular organic compound or a high molecular organic compound. For example, the low molecular organic compound may include at least one compound selected from copper phthalocyanine, diphenylbenzidine (N, N'-diphenylbenzidine), trihydroxyquinoline aluminum (tris-(8-hydroxyquinoline)aluminum), and the like. The high molecular organic compound may include at least one compound selected from poly ethylenedioxythiophene (poly(3,4-ethylenedioxythiophene), polyaniline, polyphenylenevinylene, polyfluorene, and the like.

In an exemplary embodiment, the quantum dot may include a core including a group II-VI compound, a group III-V compound, a group IV-VI compound, a group IV element, a group IV compound, and a combination thereof. In an exemplary embodiment, the quantum dot may have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

A pixel defining layer 330 may be disposed between the first light emitting element 310 and the second light emitting element 320. As shown in the exemplary embodiment of FIG. 3, the pixel defining layer 330 may cover a peripheral portion of the first electrode 311 (e.g., lateral ends of the first electrode 311), and may include an opening exposing a central portion of the first electrode 311. The emission layer 313 may be disposed on the first electrode 311 in the opening of the pixel defining layer 330, and the second electrode 312 may be disposed on the emission layer 313 and the pixel defining layer 330.

The pixel defining layer 330 may define an emission area of each of the first light emitting element 310 and the second light emitting element 320. For example, as shown in the exemplary embodiment of FIG. 4, a first emission area EA1 of the first light emitting element 310 and a second emission area EA2 of the second light emitting element 320 may be defined by the pixel defining layer 330. Further, the pixel defining layer 330 may increase a distance between the peripheral portion of the first electrode 311 and the second electrode 312 thereby preventing arc or the like from occurring between the peripheral portion of the first electrode 311 and the second electrode 312.

As shown in the exemplary embodiment of FIG. 3, a size of the second emission area EA2 may be greater than a size of the first emission area EA. In this exemplary embodiment, a brightness of light emitted from the second emission area EA2 may be greater than a brightness of light emitted from the first emission area EA1.

The first encapsulation layer 410 may be disposed on the first light emitting element 310 and the second light emitting element 320. The first encapsulation layer 410 may be disposed on the second electrode 312. The first encapsulation layer 410 may include an inorganic insulation material. For example, the first encapsulation layer 410 may include at least one compound selected from silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and the like. In an exemplary embodiment, the first encapsulation layer 410 may be formed by a deposition process.

The second encapsulation layer 420 may be disposed on the first encapsulation layer 410. The second encapsulation layer 420 may include an organic insulation material. For example, the second encapsulation layer 420 may include at least one compound selected from acryl-based resin, methacryl-based resin, polyisoprene, vinyl-based resin, epoxy-based resin, urethane-based resin, cellulose-based resin, perylene-based resin, and the like. In an exemplary embodiment, the second encapsulation layer 420 may be formed by a liquid process such as spin coating, slit coating, inkjet process, or the like. However, exemplary embodiments of the present inventive concepts are not limited thereto.

The third encapsulation layer 430 may be disposed on the second encapsulation layer 420. The third encapsulation layer 430 may include an inorganic insulation material. For example, the third encapsulation layer 430 may include at least one compound selected from silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and the like. In an exemplary embodiment, the third encapsulation layer 430 may include substantially the same material as the material of the first encapsulation layer 410. However, exemplary embodiments of the present inventive concepts are not limited thereto and in another exemplary embodiment, the third encapsulation layer 430 may include a different material from the material of the first encapsulation layer 410. In an exemplary embodiment, the third encapsulation layer 430 may be formed by a deposition process.

The light path control layer 440 may be disposed between the first encapsulation layer 410 and the second encapsulation layer 420 (e.g., in a thickness direction of the substrate 100). As shown in the exemplary embodiment of FIG. 3, the light path control layer 440 may include a plurality of first patterns 441, a plurality of second patterns 442, and a capping layer 443.

As shown in the exemplary embodiment of FIG. 3, the first patterns 441 and the second patterns 442 may be alternatively disposed on the first encapsulation layer 410. Each of the first patterns 441 may be disposed between adjacent second patterns 442. However, exemplary embodiments of the present inventive concepts are not limited thereto.

In an exemplary embodiment, each of the first patterns 441 may be an air gap. For example, each of the first patterns 441 may be an empty space.

In an exemplary embodiment, the second patterns 442 may include an organic insulation material. For example, in an exemplary embodiment, the second patterns 442 may include polyimide-based resin. In an exemplary embodiment, an organic insulation layer may be formed on the first encapsulation layer 410 by a liquid process such as spin coating, slit coating, inkjet process, or the like. The organic insulation layer may then be patterned by an etching process such as a dry etching or the like to form the second patterns 442 and the first patterns 441 each of which is the air gap.

In an exemplary embodiment, a cross section of the second pattern 442 may have a shape in which a width (e.g., length in a direction parallel to an upper surface of the substrate 100) of the lower side of the second pattern 442 is less than the width of an upper side of the second pattern. For example, the second pattern 442 may have an inverse-tapered structure. As shown in the exemplary embodiment of FIG. 3, a lower surface 442L of the second pattern 442 may directly contact the first encapsulation layer 410, and an upper surface 442U of the second pattern 442 may directly contact the capping layer 443. Since the second pattern 442 has the inverse-tapered structure, a gap (e.g., a length in a direction parallel to an upper surface of the substrate 100) between upper surfaces 442U of adjacent second patterns 442 may be less than a gap between lower surfaces 442L of adjacent second patterns 442.

The capping layer 443 may be disposed on the first and second patterns 441, 442. For example, the capping layer 443 may directly contact the upper surface 442U of each of the first and second patterns 441, 442. The capping layer 443 may cover the second patterns 442, and may prevent the first pattern 441, which is the air gap, from being exposed through the gap between the upper surfaces 442U of adjacent second patterns 442. Accordingly, the capping layer 443 may prevent an organic insulation material for forming the second encapsulation layer 420 from flowing into the first pattern 441, which is the air gap, through the gap between the upper surfaces 442U of adjacent second patterns 442 in a process of forming the second encapsulation layer 420 on the light path control layer 440. In an exemplary embodiment, the capping layer 443 may include polyimide (PI).

The first pattern 441 may overlap (e.g., in a thickness direction of the substrate 100) the first light emitting element 310, and the second pattern 442 may overlap (e.g., in a thickness direction of the substrate 100) the second light emitting element 320. For example, the first pattern 441 may be disposed to overlap the first emission area EA1, and the second pattern 442 may be disposed to overlap the second emission area EA2. However, as shown in the exemplary embodiment of FIG. 3, lateral ends of the upper surface 442U of the second pattern 442 having an increased width may extend to also overlap a portion of the first emission area EA1. The gap between upper surfaces 442U of adjacent second patterns 442 may extend over a central portion of the first light emission area EA. Accordingly, light emitted from the emission layer 313 of the first light emitting element 310 to lateral sides of the first light emission area EA1 which surround the central portion of the first light emission area EA1 may pass through the first pattern 441, the second pattern 442, the capping layer 443, the second encapsulation layer 420, and the third encapsulation layer 430. Light emitted from the emission layer 313 of the first light emitting element 310 to the central portion of the first light emission area EA1 may pass through the first pattern 441, the capping layer 443, the second encapsulation layer 420, and the third encapsulation layer 430. Further, light emitted from the emission layer 323 of the second light emitting element 320 may pass through the second pattern 442, the capping layer 443, the second encapsulation layer 420, and the third encapsulation layer 430.

A first refractive index of the first pattern 441 may be less than a refractive index of the layers (e.g., the second pattern 442, the capping layer 443, the second encapsulation layer 420, and third encapsulation layer 430) positioned above the first pattern 441. For example, the capping layer 443 may be positioned directly above the portion of the first pattern 441 disposed in the central portion of the first light emission area EA1 whereas the second pattern 442 may be directly above the portion of the first pattern 441 disposed on lateral sides of the first light emission area EA1. For example, in an exemplary embodiment, the first refractive index of the first pattern 441 may be about 1.0, and the refractive index of the layer positioned above the first pattern 441 may be greater than about 1.0. Since the first refractive index of the first pattern 441 is less than the refractive index of the layer positioned above the first pattern 441, a refraction angle of light refracted at an interface between the first pattern 441 and the layer (e.g., the second pattern 442 or the capping layer 443) positioned directly above the first pattern 441 may be less than an incidence angle of light incident to the interface between the first pattern 441 and the layer positioned above the first pattern 441. Accordingly, light emitted from the emission layer 313 of the first light emitting element 310 toward a side of the display device 10 may be refracted at the interface between the first pattern 441 and the layer positioned above the first pattern 441 to a front direction DF of the display device 10, and then, may be emitted toward a front of the display device 10.

A second refractive index of the second pattern 442 may be greater than the first refractive index of the first pattern 441. Since the second refractive index of the second pattern 442 is greater than the first refractive index of the first pattern 441, a refraction angle of light refracted at an interface between the second pattern 442 and a layer positioned above the second pattern 442 may be greater than a refraction angle of light refracted at an interface between the first pattern 441 and a layer positioned above the first pattern 441.

In an exemplary embodiment, the second refractive index of the second pattern 442 may be greater than or equal to a refractive index of the layers positioned above the second pattern 442. For example, the second refractive index of the second pattern 442 may be greater than or equal to the refractive indexes of the capping layer 443, the second encapsulation layer 420, and the third encapsulation layer 430 disposed thereabove. In an exemplary embodiment, the second refractive index of the second pattern 442 may be about 1.89, and the refractive index of the layers positioned above the second pattern 442 may be less than or equal to about 1.89. Since the second refractive index of the second pattern 442 is greater than or equal to the refractive index of the capping layer 443 positioned directly above the second pattern 442, a refraction angle of light refracted at an interface between the second pattern 442 and the capping layer 443 positioned directly above the second pattern 442 may be greater than or equal to an incidence angle of light incident to the interface between the second pattern 442 and the capping layer 443 positioned directly above the second pattern 442. Accordingly, light emitted from the emission layer 323 of the second light emitting element 320 toward a side of the display device 10 may not be substantially refracted at the interface between the second pattern 442 and the capping layer 443 or may be refracted to a side direction DS of the display device 10, and then, may be emitted toward a side of the display device 10.

Figure 4:
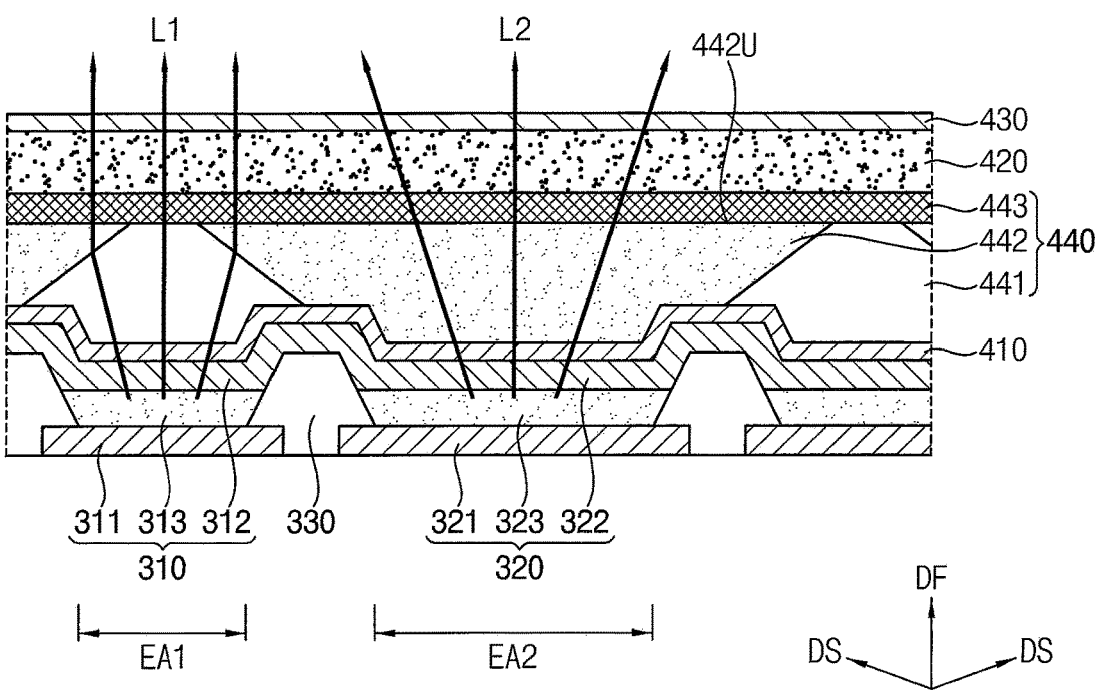
FIG. 4 is an enlarged cross-sectional view taken along area A of FIG. 2 of an emission unit and an encapsulation unit illustrating a path of light emitted in a first mode according to an exemplary embodiment of the present inventive concepts.

FIG. 4 is a diagram illustrating a path of light emitted in the first mode according to an exemplary embodiment of the present inventive concepts.

Referring to the exemplary embodiments of FIGS. 3 and 4, the first light emitting element 310 and the second light emitting element 320 may both emit light in the first mode. As described above, the first mode may be a normal mode providing an image with a relatively wide viewing angle. Since light L1 emitted from the first light emitting element 310 is refracted at the interface between the first pattern 441 and the layer (e.g., the second pattern 442 or the capping layer 443) positioned above the first pattern 441 to the front direction DF of the display device 10, an image displayed by the first pixels PX1 which include the first light emitting elements 310 may be provided with a relatively narrow viewing angle. Further, since light L2 emitted from the second light emitting element 320 is not substantially refracted at the interface between the second pattern 442 and the capping layer 443 positioned above the second pattern 442 or is refracted to the side direction DS of the display device 10, an image displayed by the second pixels PX2 which include the second light emitting elements 320 may be provided with a relatively wide viewing angle. Since both the first light emitting element 310 and the second light emitting element 320 emit light in the first mode, the display device 10 may provide an image with a relatively wide viewing angle. Accordingly, a user positioned at a lateral side of the display device 10 as well as a user positioned at a front of the display device 10 may observe the image in the first mode.

Figure 5:
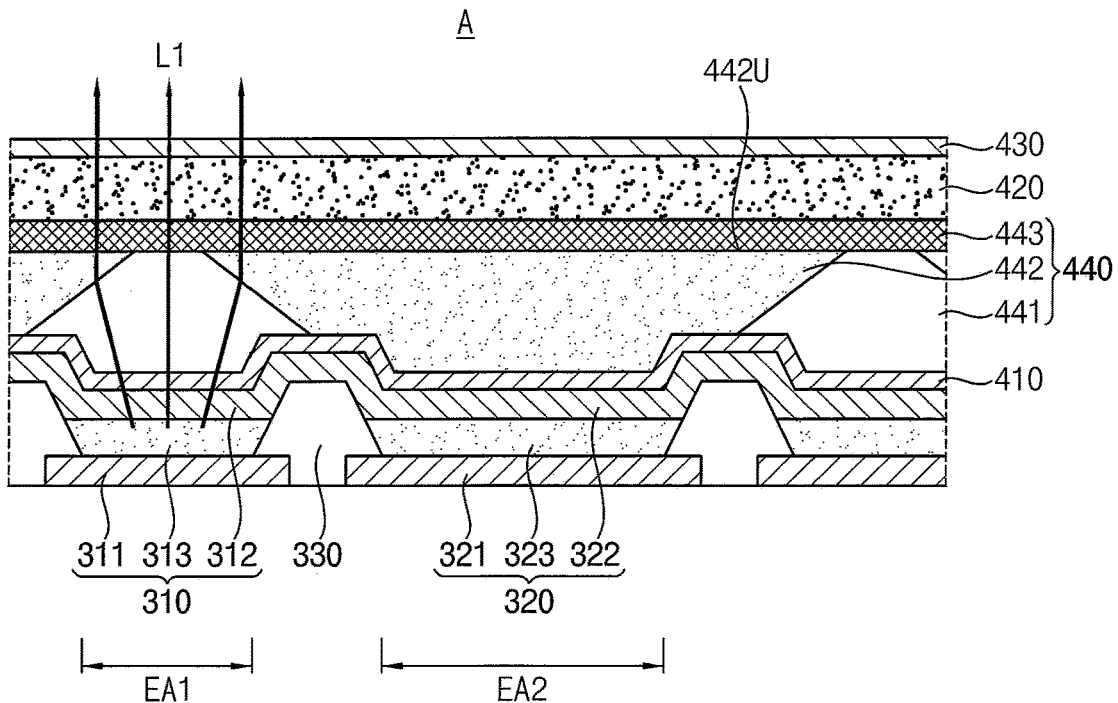
FIG. 5 is an enlarged cross-sectional view taken along area A of FIG. 2 of an emission unit and an encapsulation unit illustrating a path of light emitted in a second mode according to an exemplary embodiment of the present inventive concepts.

FIG. 5 is a diagram illustrating a path of light emitted in the second mode according to an exemplary embodiment of the present inventive concepts.

Referring to the exemplary embodiments of FIGS. 3 and 5, the first light emitting element 310 may emit light and the second light emitting element 320 may not emit light in the second mode. As described above, the second mode may be a private mode which provides an image with a relatively narrow viewing angle. Since the first light emitting element 310 emits light and the second light emitting element 320 does not emit light in the second mode, the display device 10 may provide an image with a relatively narrow viewing angle. Accordingly, only a user positioned at a front of the display device 10 may observe the image and a user positioned at a side of the display device 10 may not observe the image in the second mode. While the exemplary embodiments of FIGS. 3-4 show the first and second modes with respect to first and second light emitting elements 310, 320, in other exemplary embodiments in which the display device includes three or more plurality of light emitting elements, the first and second modes of the display device may be variously arranged such that fewer light emitting elements display light in the second mode as compared to the first mode to provide a relatively narrower viewing angle than in the first mode.

Figure 6:
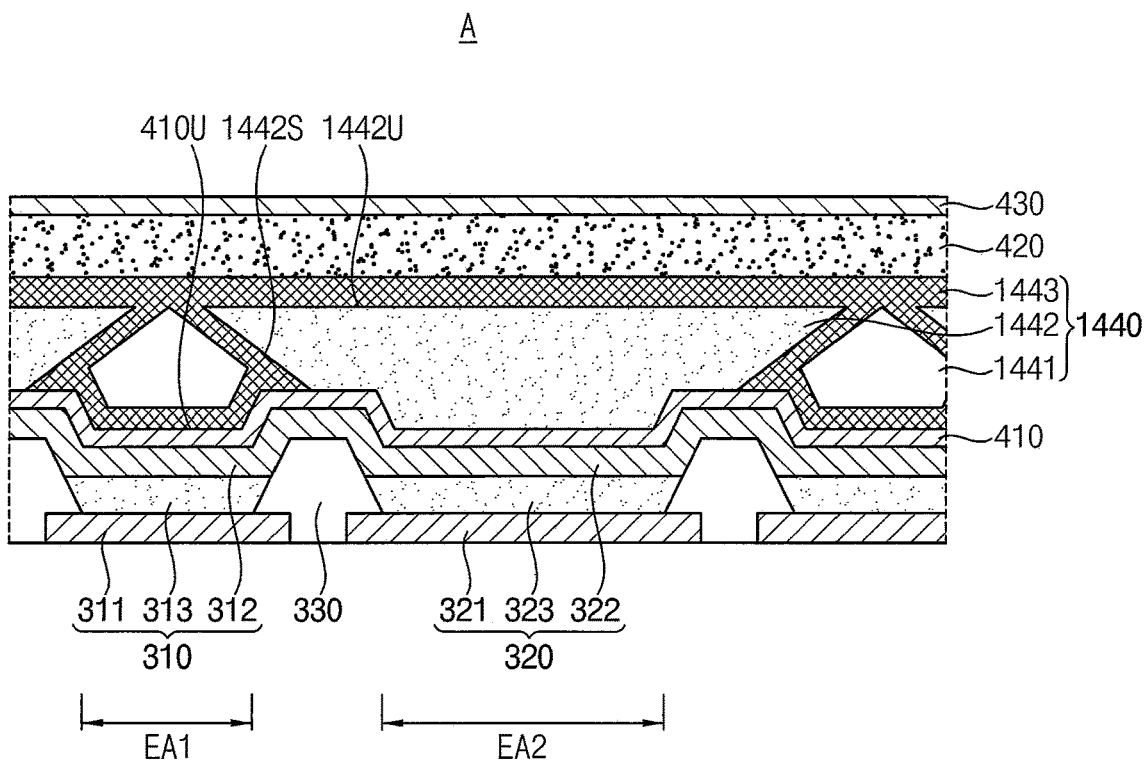
FIG. 6 is an enlarged cross-sectional view taken along area A of FIG. 2 of an emission unit and an encapsulation unit according to another exemplary embodiment of the present inventive concepts.

FIG. 6 is an enlarged cross-sectional view illustrating the emission unit 300 and the encapsulation unit 400 according to another exemplary embodiment of the present inventive concepts. For example, FIG. 6 may illustrate another example of the area A in FIG. 2.

The emission unit 300 and the encapsulation unit 400 described with reference to the exemplary embodiment of FIG. 6 may be substantially the same as or similar to the emission unit 300 and the encapsulation unit 400 described with reference to the exemplary embodiment of FIG. 3 except for a light path control layer 1440. Accordingly, descriptions on elements of the emission unit 300 and the encapsulation unit 400 described with reference to FIG. 6, which are substantially the same as or similar to those of the emission unit 300 and the encapsulation unit 400 described with reference to FIG. 3, will not be repeated for convenience of explanation.

Referring to the exemplary embodiments of FIGS. 2 and 6, the light path control layer 1440 may be disposed between the first encapsulation layer 410 and the second encapsulation layer 420. The light path control layer 1440 may include a plurality of first patterns 1441, a plurality of second patterns 1442, and a capping layer 1443.

The first patterns 1441 and the second patterns 1442 may be alternatively disposed on the first encapsulation layer 410. Each of the first patterns 1441 may be disposed between adjacent second patterns 1442.

The capping layer 1443 may be disposed on the second patterns 1442. The capping layer 1443 may directly contact the upper surface 410U of the first encapsulation layer 410, a sidewall 1442S of each of the second patterns 1442, and an upper surface 1442U of each of the second patterns 1442. In this exemplary embodiment, the capping layer 1443 may surround the first patterns 1441. The capping layer 1443 may prevent external gas, moisture, or the like from flowing into the emission unit 300 together with the first encapsulation layer 410. Further, the capping layer 1443 may cover the second patterns 1442 to prevent the first pattern 1441, which is an air gap, from being exposed through a gap between the upper surfaces 1442U of adjacent second patterns 1442. In an exemplary embodiment, the capping layer 443 may include lithium fluoride (LiF). The capping layer 1443 may be formed by a deposition process or the like.

The display device according to exemplary embodiments of the present inventive concepts may be applied to a display device included in a computer, a notebook, a mobile phone, a smartphone, a smart pad, a PMP, a PDA, an MP3 player, or the like. However, exemplary embodiments of the present inventive concepts are not limited thereto and the display device may be included in various other large, medium and small electronic devices.

Although the display device according to exemplary embodiments of the present inventive concepts have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
 a substrate;
 a first light emitting element disposed on the substrate;
 a second light emitting element disposed on the substrate and positioned adjacent to the first light emitting element;
 a first encapsulation layer disposed on the first light emitting element and the second light emitting element; and
 a light path control layer disposed on the first encapsulation layer, the light path control layer including a first pattern overlapping the first light emitting element and having a first refractive index and a second pattern overlapping the second light emitting element and having a second refractive index that is greater than the first refractive index, wherein an emission area of the second light emitting element is a different size from that of an emission area of the first light emitting element, wherein the first pattern does not overlap the second light emitting element, and wherein the light path control layer further includes a capping layer directly disposed on the first pattern, wherein the second pattern includes a first side surface and a second side surface opposite to the first side surface, wherein each of the first side surface and the second side surface is slanted with respect to an upper surface of the first encapsulation layer, wherein each of the first side surface and the second side surface extends from a bottom surface of the capping layer to the upper surface of the first encapsulation layer and contacts the capping layer and the first encapsulation layer.

2. The display device of claim 1, wherein the first encapsulation layer includes an inorganic insulation material.

3. The display device of claim 1, wherein the second pattern includes an organic insulation material.

4. The display device of claim 1, wherein a cross section of the second pattern has a shape in which a width of a lower side of the second pattern is less than a width of an upper side of the second pattern.

5. The display device of claim 1, wherein the capping layer is disposed on the second pattern.

6. The display device of claim 5, wherein the capping layer includes polyimide (PI).

7. The display device of claim 5, wherein the capping layer includes lithium fluoride (LiF).

8. The display device of claim 5, wherein the capping layer directly contacts an upper surface of the second pattern.

9. The display device of claim 5, wherein the capping layer directly contacts an upper surface of the first encapsulation layer, a sidewall of the second pattern, and an upper surface of the second pattern.

10. The display device of claim 1, further comprising:
a second encapsulation layer disposed on the light path control layer, wherein the second encapsulation layer includes an organic insulation material.

11. The display device of claim 10, further comprising:
a third encapsulation layer disposed on the second encapsulation layer, the third encapsulation layer including an inorganic insulation material.

12. The display device of claim 1, wherein a light emitted from the second light emitting element is a same color as a color of a light emitted from the first light emitting element.

13. The display device of claim 1, wherein the emission area of the second light emitting element is larger than the emission area of the first light emitting element.

14. The display device of claim 1, wherein:
each of the first light emitting element and the second light emitting element are configured to emit a light in a first mode; and
the first light emitting element is configured to emit the light and the second light emitting element is not configured to emit the light in a second mode.

15. A display device, comprising:
a substrate;
a first light emitting element disposed on the substrate;
a second light emitting element disposed on the substrate and positioned adjacent to the first light emitting element;
a first encapsulation layer disposed on the first light emitting element and the second light emitting element; and
a light path control layer disposed on the first encapsulation layer, the light path control layer including a first pattern overlapping the first light emitting element and having a first refractive index and a second pattern overlapping the second light emitting element and having a second refractive index that is greater than the first refractive index, wherein the first pattern is an air gap.

16. A display device, comprising:
a substrate;
an emission unit disposed on the substrate; and
an encapsulation unit covering the emission unit,
wherein the encapsulation unit includes:
a first encapsulation layer disposed on the emission unit;
a light path control layer disposed on the first encapsulation layer, the light path control layer including a plurality of first patterns having a first refractive index and a plurality of second patterns having a second refractive index that is greater than the first refractive index; and
a second encapsulation layer disposed on the light path control layer, wherein the emission unit includes:
a plurality of first light emitting elements respectively overlapping the first patterns; and
a plurality of second light emitting elements respectively overlapping the second patterns,
wherein:
each of the first light emitting elements and the second light emitting elements are configured to emit a light in a first mode, and
each of the first light emitting elements are configured to emit the light and each of the second light emitting elements are not configured to emit the light in a second mode.

17. The display device of claim 16, wherein a cross section of each of the second patterns has a shape in which a width of a lower side of each of the second patterns is less than a width of an upper side of each of the second patterns.

18. The display device of claim 16, wherein the light path control layer further includes a capping layer disposed on the second patterns.

* * * * *